United States Patent
Horng et al.

(10) Patent No.: US 8,193,546 B2
(45) Date of Patent: Jun. 5, 2012

(54) LIGHT-EMITTING-DIODE ARRAY WITH POLYMER BETWEEN LIGHT EMITTING DEVICES

(75) Inventors: Ray-Hua Horng, Taichung (TW); Yi-An Lu, Chiayi (TW); Heng Liu, Sunnyvale, CA (US)

(73) Assignee: Pinecone Energies, Inc., Tortola (VG)

( * ) Notice: Subject to any disclaimer, the term of this patent is extended or adjusted under 35 U.S.C. 154(b) by 0 days.

(21) Appl. No.: 12/948,504

(22) Filed: Nov. 17, 2010

(65) Prior Publication Data
US 2011/0108862 A1 May 12, 2011

Related U.S. Application Data

(60) Provisional application No. 61/351,779, filed on Jun. 4, 2010.

(51) Int. Cl.
*H01L 21/00* (2006.01)
*H01L 21/44* (2006.01)
*H01L 29/207* (2006.01)
*H01L 29/06* (2006.01)
*H01L 23/48* (2006.01)

(52) U.S. Cl. ..... 257/93; 257/626; 257/786; 257/E33.06; 257/E33.062; 257/E33.065; 438/28; 438/666

(58) Field of Classification Search ............... 257/88, 257/93, 594, 626, 786, E33.06, E33.062, 257/E33.065; 438/28, 666
See application file for complete search history.

(56) References Cited

U.S. PATENT DOCUMENTS

| 6,410,942 | B1 | 6/2002 | Thibeault | |
|---|---|---|---|---|
| 6,547,249 | B2* | 4/2003 | Collins et al. | 257/88 |
| 7,172,913 | B2* | 2/2007 | Lee et al. | 438/30 |
| 7,368,756 | B2* | 5/2008 | Bruhns et al. | 257/93 |
| 7,947,993 | B2* | 5/2011 | Kim et al. | 257/93 |
| 2004/0122328 | A1* | 6/2004 | Wang et al. | 600/476 |
| 2006/0169993 | A1* | 8/2006 | Fan et al. | 257/88 |
| 2006/0270179 | A1* | 11/2006 | Yang | 438/401 |
| 2007/0045761 | A1* | 3/2007 | Basin et al. | 257/440 |
| 2008/0093728 | A1* | 4/2008 | Mahler et al. | 257/701 |
| 2010/0051916 | A1* | 3/2010 | Sirringhaus et al. | 257/40 |
| 2010/0109030 | A1* | 5/2010 | Krames et al. | 257/93 |

FOREIGN PATENT DOCUMENTS

| JP | 10107316 | 4/1998 |
|---|---|---|
| KR | 1020050109231 | 10/2006 |
| KR | 1020100036618 | 4/2010 |

OTHER PUBLICATIONS

U.S. Appl. No. 12/199,592, filed Feb. 26, 2009, John Adam Edmond.

(Continued)

*Primary Examiner* — Kevin Parendo
(74) *Attorney, Agent, or Firm* — James W. Huffman

(57) ABSTRACT

A light-emitting-diode (LED) array includes a first LED device having a first electrode and a second LED device having a second electrode. The first and the second LED device are formed on a common substrate and are separated by a gap. At least one polymer material substantially fills the gap. An interconnect, formed on top of the at least one polymer material, electrically connects the first electrode and the second electrode.

14 Claims, 6 Drawing Sheets

OTHER PUBLICATIONS

Cho, et al., "Alternating-current Light Emitting Diodes with a Diode Bridge Circuitry", Japanese Journal of Applied Physics, vol. 46, No. 48, 2007, pp. L1194-L1196.

Yen, et al., "Characteristics of Single-Chip GaN-Based Alternating Current Light-Emitting Diode", Japanese Journal of Applied Physics, vol. 47, No. 12, 2008, pp. 8808-8810.

Yen, et al., "GaN alternating current light-emitting device", phys. stat. sol. (a) 204, No. 6, 2077-2081 (2007) / DOI 10.1002/pssa.200674766.

Ao, et al., "Monolithic Blue LED Series Arrays for High-Voltage AC Operation", phys. stat. sol. (a) 194, No. 2, 376-379 (2002).

Korean Office Action Appln. No. 2010-125632 dated Apr. 15, 2011.

* cited by examiner

LIGHT-EMITTING-DIODE ARRAY WITH POLYMER BETWEEN LIGHT EMITTING DEVICES

CROSS REFERENCE

This application claims the benefits of U.S. Provisional Patent Application Ser. No. 61/351,779, which was filed on Jun. 4, 2010 and entitled "Interconnect structure & process for multi-mesa based LED chip by gap-filling with polymer and low melting temperature metal connect."

BACKGROUND

The present invention relates generally to semiconductor-based light emitting devices, and, more particularly, to a structure of such devices and a method for manufacturing the same.

A Light-emitting diode (LED) is a semiconductor diode based light source. When a diode is forward biased (switched on), electrons are able to recombine with holes within the device, releasing energy in the form of photons. This effect is called electroluminescence and the color of the light (corresponding to the energy of the photon) is determined by the energy gap of the semiconductor. When used as a light source, the LED presents many advantages over incandescent light sources. These advantages include lower energy consumption, longer lifetime, improved robustness, smaller size, faster switching, and greater durability and reliability.

FIG. 1 is a perspective view of a LED die 100 which comprises a substrate 102, an N-type layer 110, a light-emitting layer 125 and a P-type layer 130. N-contact and p-contact 115 and 135 are formed on the N-type layer 110 and the P-type layer 130, respectively, for making electrical connections thereto. When a proper voltage is applied to the N- and P-contacts 115 and 135, electrons depart the N-type layer 110 and combine with holes in the light-emitting layer 125. The electron-hole combination in the light-emitting layer 125 generates light. Sapphire is a common material for making the substrate 102. The N-type layer 110 may be made of, for example, AlGaN doped with Si or GaN doped with Si. The P-type layer 240 may be made of, for example, AlGaN doped with Mg or GaN doped with Mg. The light-emitting layer 125 is typically formed by a single quantum well or multiple quantum wells, e.g. InGaN/GaN.

In some cases, a series or parallel LED array is formed on an insulating or highly resistive substrate (e.g. sapphire, SiC, or other III-nitride substrates). The individual LEDs are separated from each other by trenches, and interconnects deposited on the array electrically connect the contacts of the individual LEDs in the arrays. Typically, to make sure complete electrical isolation of individual LEDs, a dielectric material is deposited over the LED array before the interconnects deposition, then patterned and removed in places to open contact holes on N-type layer and P-type layer, such that dielectric material is left in trench between the individual LEDs on the substrate and on the mesa walls between the exposed P-type layer and N-type layer of each LED. Dielectric material may be, for example, oxides of silicon, nitrides of silicon, oxynitrides of silicon, aluminum oxide, or any other suitable dielectric material.

However, deposition of dielectric material is a slow and costly process. Moreover, subsequently formed interconnects which poses reliability concern due to complex profiles and sharp corners of the interconnects. As such, what is desired is a system and method for manufacturing a LED array device cost-effectively and with improved long term reliability.

SUMMARY

A light-emitting-diode (LED) array is disclosed which comprise a first LED device having a first electrode, a second LED device having a second electrode, wherein the first and the second LED device are formed on the same substrate and separated by a gap, at least one polymer material substantially filling the gap, and an interconnect, formed on top of the at least one polymer material, electrically connecting the first and the second electrode.

In another aspect of the present invention, a method for forming a light-emitting-diode (LED) array is disclosed which comprises forming a LED structure on a substrate, dividing the LED structure into at least a first and a second LED device with a gap, depositing at least one polymer material over the LED structure substantially filling the gap, removing portions of the at least one polymer material to expose a first electrode of the first LED device and a second electrode of the second LED device, and forming an interconnect on top of the at least one polymer material electrically connecting the first and second electrode.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein.

DESCRIPTION

The present invention discloses a LED array structure and a process method for manufacturing the same. The LED array is formed by multiple LED devices for producing significant amount of light at relatively low current density. Low current density generates less heat and allows polymer materials to be used in forming the LED array. Details of the LED array structure and the process for manufacturing the same are described hereinafter.

Figure 1:
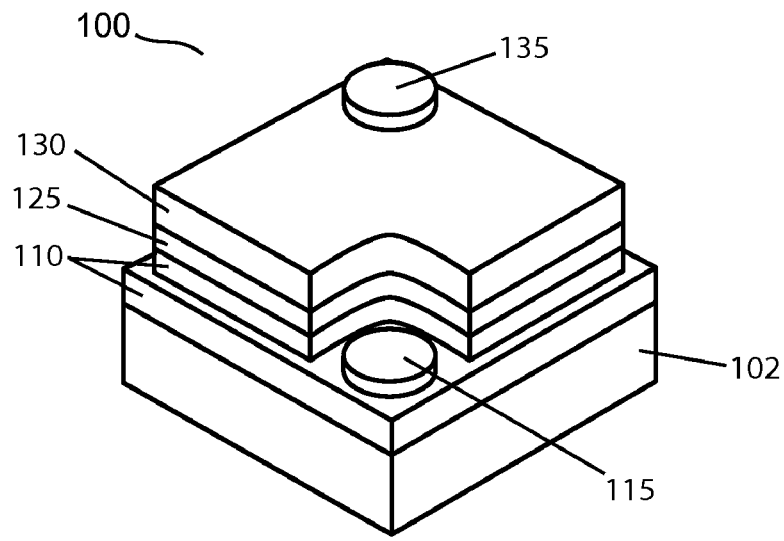
FIG. 1 is a perspective view of a LED die.
Figure 2A:
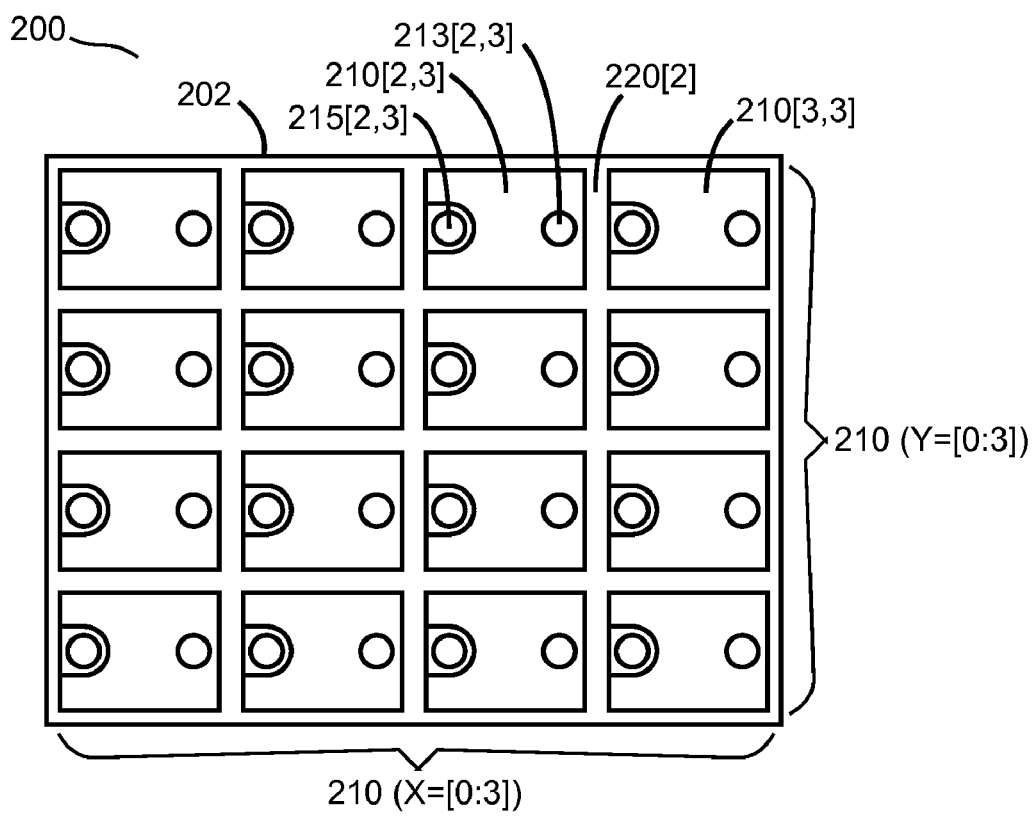
FIGS. 2A and 2B are top views of an LED array in a single substrate.
Figure 2B:
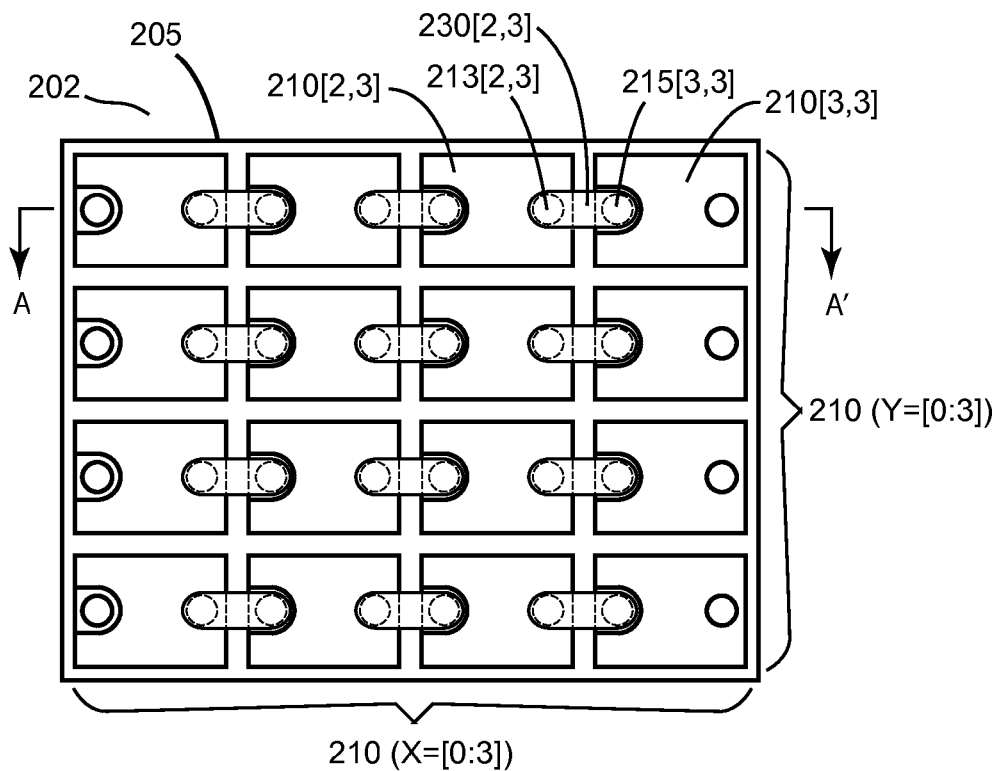

FIGS. 2A and 2B is a top view of an of LED array 200 in a single substrate 205. Referring to FIG. 2A and for illustration purpose, the LED array 200 has four rows (Y) and four columns (X) of separated yet identical LED devices 210[0:3, 0:3], each shaped like a mesa. The LED devices 210 may be separated by laser etching or Inductively Coupled Plasma Reactive Ion Etching (ICP-RIE). As an example, neighboring LED devices, 210[2, 3] and 210[3, 3] are separated by a gap 220[2]. The LED device 210[2, 3] has two electrodes, i.e., pads 213[2, 3] and 215[2, 3] serving as anode and a cathode of the LED device 210[2, 3], respectively. The electrodes can be formed on P-GaN and N-GaN (either P-side up or N-side up). One LED device's anode pad is placed close to a neighboring LED device's cathode pad, so that the LED devices 210 can be easily connected in series.

Referring now to FIG. 2B, the pad 213[2, 3] and the pad 215[3, 3] are connected by an interconnect 230[2, 3]. The pads 213 and 215 are typically formed by a metal, and so is the interconnect 230. The pads 213 and 215 and the interconnect 230 may not necessarily be formed by the same metal.

Figure 3:
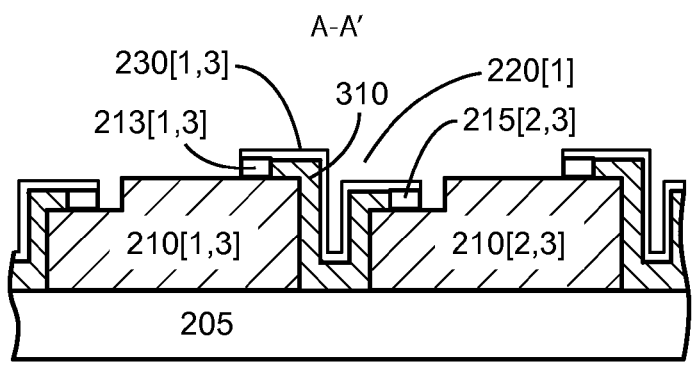
FIG. 3 is a cross-sectional view of the conventional LED array shown in FIG. 2B.

FIG. 3 is a cross-sectional view of the conventional LED array 202 at a location A-A' shown in FIG. 2B. On a single substrate 205, multiple LED devices 210 are built with cross-sections of two adjacent ones, 210[1, 3] and 210[2, 3] shown in FIG. 3. The pad 213[1, 3], for instance, is an anode of the LED device 210[1, 3]. The pad 215[2, 3] is a cathode of the LED device 210[2, 3]. Conventionally, an oxide layer 310 is deposited in the gap 220[1] between the LED devices 210 to electrically isolate the pads 213 and 215 from adjacent structures. Then the metal interconnect 230[1, 3] is formed on top of the oxide layer 310 to connect the pads 213[1, 3] and 215[2, 3]. Due to the depth of gap 220, the oxide layer 310 cannot fill up the gap 220, and causing the metal interconnect 230 to form a complex profile with sharp corners. The sharp corners are relatively easy to break hence become a reliability concern.

Figure 4A:
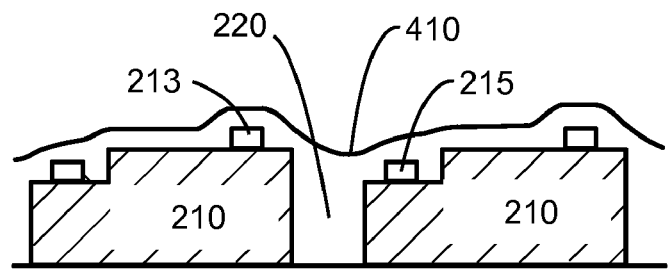
FIGS. 4A-4C illustrates processing steps for forming a LED device according to an embodiment of the present invention.
Figure 4B:
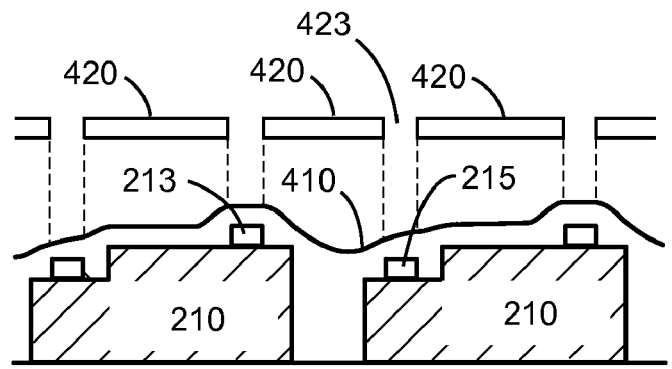
Figure 4C:
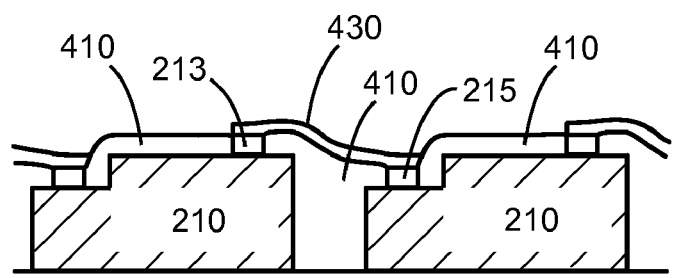

FIGS. 4A-4C illustrates processing steps that uses a polymer to fill up the gap 220 between the LED devices 210 according to an embodiment of the present invention. Because the LED devices in accordance with the present invention are intended to be used at high efficiency with little heat generated, it is feasible to leave polymer material in a finished LED device.

Referring to FIG. 4A, after each individual LED devices 210 and respective pads 213 and 215 are formed, a polymer layer 410 is deposited over the LED devices 210. The polymer layer 410 fills up the gap 220. Photoresist, such as polymethylglutarimide (PMGI) or SU-8, is a preferred polymer material. Refractive index of the polymer layer 410 ranges from 1 to 2.6 (between air and semiconductor) to enhance light extraction. Optical transparency of the polymer layer 410 is equal to or more than 90%, and preferably equal to or more than 99%. Typically, a thickness of the polymer layer 410 measured on top of the pad 213 is approximately 2 micron meter. The polymer layer 410 can be pre-mixed with phosphor (about 30 weight percentage loading) to adjust the output light color. However, the relative dimension between polymer coating thickness and phosphor particle size should be coordinated. For example, when a thickness of the polymer layer 410 at the pad 213 is about 3 micron meter, proper phosphor particle size is approximately 3 micron meter or less.

Referring to FIG. 4B, a patterned mask 420 is applied over the polymer layer 410. The mask 420 has openings 423 at the locations of pads 213 and 215 to allow the removal of the polymer layer 410 thereon. The polymer removal process also smooth out surface profile of the polymer layer 410.

After the polymer removal process and pads 213 and 215 being exposed, a surface hydrophilic modification is performed on the polymer surface (e.g., oxygen plasma) to transform the originally hydrophobic surface into hydrophilic surface. Therefore, a subsequently formed metal-based interconnect can have improved adhesion to the polymer layer 410.

Referring to FIG. 4C, a interconnect 430 is then formed on top of the polymer layer 410 to connect the pad 213 and pad 215. Because of the smooth surface profile of the polymer layer 410, the subsequently formed metal-based interconnect 430 can have thin and smooth profile with improved endurance. In comparison, conventional interconnect (230 in FIG. 3) is easy to brake due to complex profiles and sharp corners. Even though the fragileness of the conventional interconnect 230 can be slightly improved by increasing the thickness of the interconnect 230, this is done at increased cost due to both additional material used and additional processing time.

In the present invention, as mentioned above, the LED devices 210 are intended to be used at high efficiency with little heat generated, metals with lower melting points, such as Al, In, Sn or related alloy metals, can be used to form the major component of interconnect 430 (equal to or more than 90 vol %), which further lowers the cost of producing the LED device. Fabrication processes, such as chemical vapor deposition, sputtering or evaporation of the metal can be used for forming the interconnect 430. In an exemplary process, three layers of metal, Ti/Al/Pt, are sputtered to form the interconnect 430.

Furthermore, mixture of metal powder and polymer (e.g. silver paste) can also be used to form the interconnect 430. Corresponding fabrication process may be screen printing or stencil printing process with even lower manufacture cost.

In addition, the smoothness of the polymer layer 410 allows sizes of the pads 213 and 215 and interconnect 430 to be smaller than the conventional ones shown in FIG. 3, so that less LED area will be shielded by the opaque pads 213 and 215 and interconnects 430.

In addition to the aforementioned providing a smooth surface, the polymer layer 410 can also absorb and dissipate heat from neighboring LED devices 210, especially when the polymer layer 410 is mixed with some special materials such as ceramics and carbon-based nanostructures.

Ceramics and carbon-based nanostructures absorb heat energy and emit it as far-infrared wavelength energy. Infrared radiation is a form of electromagnetic radiation with wavelengths longer than those at the red-end of the visible portion of the electromagnetic spectrum but shorter than microwave radiation. This wavelength range spans roughly 1 to several hundred microns, and is loosely subdivided—no standard definition exists—into near-infrared (0.7-1.5 microns), mid-infrared (1.5-5 microns) and the far-infrared (5 to 1000 microns).

Ceramics which are inorganic oxides, nitrides, or carbides are considered as the most effective far infrared ray emitting bodies. A number of studies on ceramic far infrared ray emitting bodies have been reported, including zirconia, titania, alumina, zinc oxides, silicon oxides, boron nitride and silicon carbides. Oxides of transition elements such as $MnO_2$, $Fe_2O_3$, CuO, CoO, and the like are considered more effective far infrared ray emitting bodies. Other far infrared ray emitting body includes carbon-based nanostructures, such as carbon nanocapsule and carbon nanotubes. They also show a high degree of radiation activity. These materials are very close to a black body exhibiting a high degree of radiation activity throughout the entire infrared range. In accordance with an embodiment of the present invention, the polymer layer 410 is pre-mixed with ceramics or carbon-based nanostructures which absorb the heat from nearby LED devices 210 and/or phosphors, and then dissipate the heat as far infrared radiation. This characteristic can be used to allow heat to escape from the LED devices 210 even when the LED devices 210 are in a sealed enclosure without heat sinks or cooling fans. Of course, with the addition of heat sinks or cooling fans heat can be better dissipated.

Figure 5:
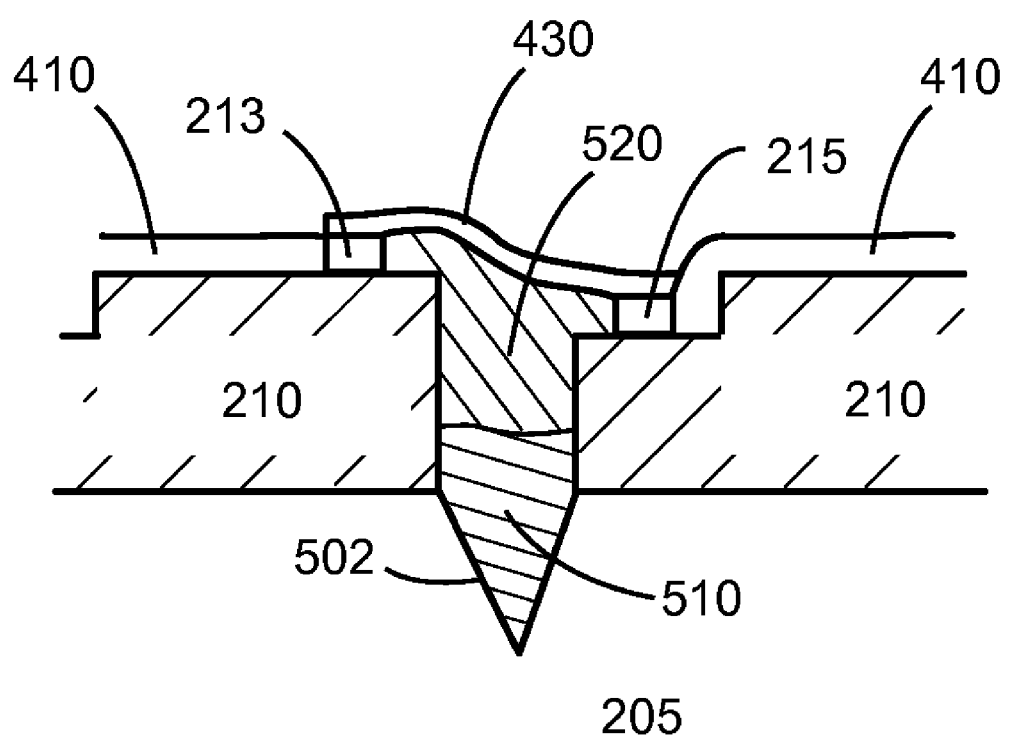
FIG. 5 illustrates a trench formed in the substrate to separate two LED devices according to another embodiment of the present invention.

FIG. 5 illustrates a trench 502 formed in the substrate 205 to separate two LED devices according to another embodiment of the present invention. The trench 502 is typically laser etched into the substrate during the formation of the gap between two LED devices 210 in order to allow more light to come out the lateral sides of the LED devices 210. As a result, light extraction efficiency of a whole LED chip that incorporates an array of the LED devices 210 will be increased. The deeper the trench 502 is, the higher the light extraction efficiency the LED chip attains. Typically, a depth of the trench 502 measured from an original surface of the substrate 205 to the bottom of the trench 502 is controlled at a range between 20 microns and 100 microns.

However, the trench 502 is more difficult to fill. As shown in FIG. 5, a PMGI layer 510 is first deposited in the trench 502, and then followed by a SU-8 layer 520 in accordance with the embodiment of the present invention. The PMGI layer 510 has better filling characteristic. The SU-8 layer 520 deposited on top of the PMGI layer 510 also serves as a barrier layer protecting the underneath PMGI layer 510 from reacting with developers in subsequent photoresist processes. One of such photoresist processes is for forming the interconnect 430 by metal sputtering in which a NR-7 patterning photoresist is used. The developer used with the NR-7 photoresist can react with the PMGI layer 510 if not for the protection of the SU-8 layer 520. However, if the interconnect 430 is formed by a silver paste in a printing process, a single PMGI layer can be used for filling the entire gap, including the trench 502, between the two LED device 210 for further saving processing cost.

Figure 6A:
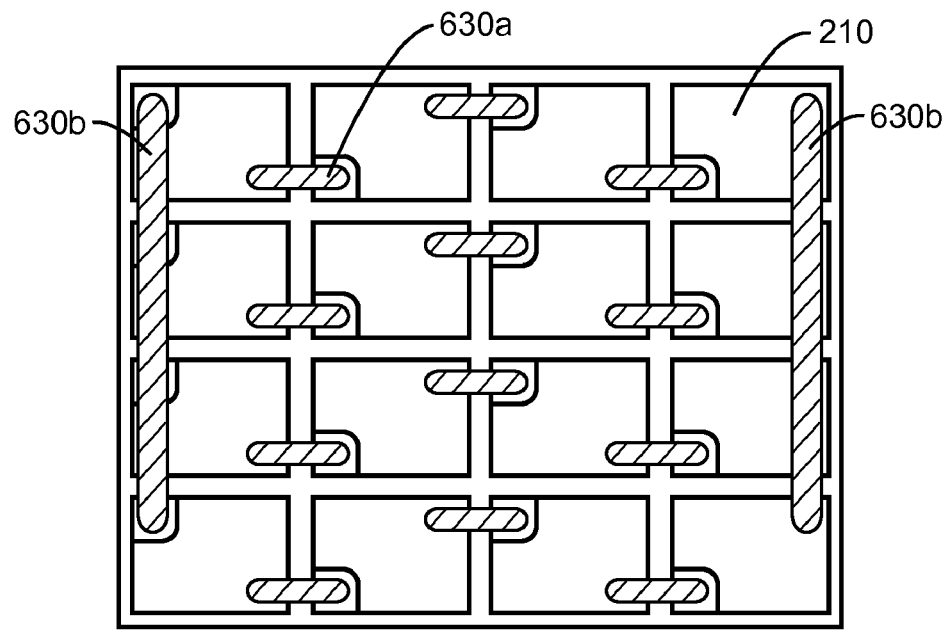
FIGS. 6A and 6B illustrate some alternative patterns of the interconnects.
Figure 6B:
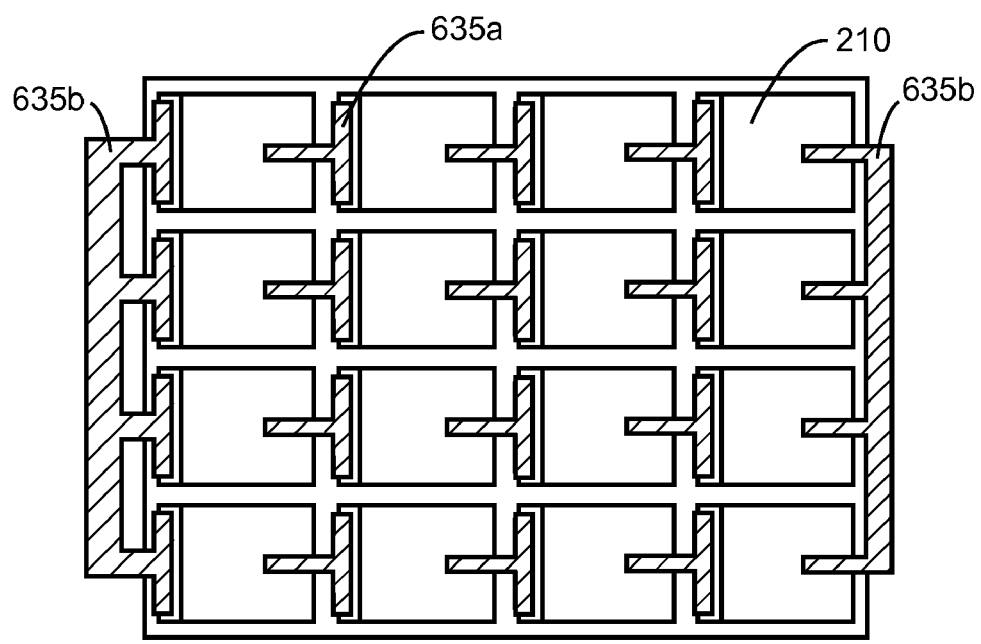

FIGS. 6A and 6B illustrate some alternative patterns of the interconnect 430. Referring to FIG. 6A, interconnects 630a and 630b are moved to edges of the LED devices 210 corresponding to relocations of electrode pads (not shown). Referring to FIG. 6B, interconnects 635a and 635b are T-shaped to connect neighboring LED devices 210. Varying the interconnect patterns is to reduce areas of the interconnects, so that less light generated by the LED devices is shielded by the interconnects.

Figure 7:
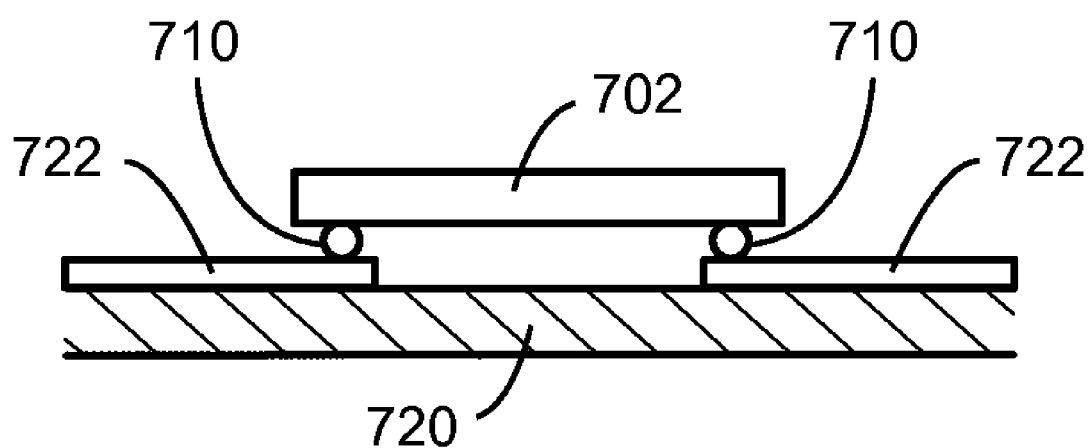
FIG. 7 illustrates a LED chip being flip mounted on a board.

FIG. 7 illustrates a LED chip 702 being flip mounted on a board 720. The LED chip 702 is produced through the processes shown in FIGS. 4A~4C, i.e., a plurality of the LED devices 210 are formed on the same substrate 205 (not shown in FIG. 7). When the substrate 205 is a sapphire which is highly transparent to light, the LED chip 702 can be flip mounted on a board 720. In such case, the substrate 205 of the LED chip 702 is on the top, the plurality of the LED devices 210 are below the substrate 205. Before the LED chip 702 being flip mounted on the board 720, solder balls 710 are first formed on the terminals of the LED chip 702. Then the LED chip 702 is flipped over and placed on the board 720 with the solder balls 710 aligned to corresponding terminal interconnects 722. After a melting process, the solder balls 710 bonds the LED chip 702 to the board 720 through the terminal interconnects 722. Apparently, the flip-chip technology yields the shortest board-level interconnects and better electrical characteristics. When multiple LED chips 702 are mounted on the same board 720, mounting density for the flip-chip mounting can be higher than conventional wire bonding. In addition, after the LED chip 702 being flip mounted on the board 720, the substrate (not shown in FIG. 7) on which the LED chip 702 is grown can be removed for even better light emission.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A light-emitting-diode (LED) array comprising:
a first LED device having a first electrode;
a second LED device having a second electrode, wherein the first and the second LED devices are formed on a common substrate and are separated by a gap, and wherein a trench is formed in the substrate below the gap;
two or more polymer materials forming a multi-layered structure, wherein a first polymer material substantially fills the trench below the gap and at least a portion of the gap, and wherein at least one additional polymer material substantially fills a remainder of the gap above the first polymer material; and
an interconnect, formed on top of the at least one polymer material, electrically connecting the first electrode and the second electrode.

2. The LED array of claim 1, wherein the first LED device and the second LED device are connected in series.

3. The LED array of claim 1, wherein the first LED device and the second LED device are connected in parallel.

4. The LED array of claim 1, wherein the two or more polymer materials comprise photoresist.

5. The LED array of claim 1, wherein the first polymer material is polymethylglutarimide (PMGI), and the at least one additional polymer material is SU-8.

6. The LED array of claim 1, wherein the optical transparency of the two or more polymer materials is equal to or higher than 90%.

7. The LED array of claim 1, wherein the refractive index of the two or more polymer materials range from 1 to 2.6.

8. The LED array of claim 1, wherein the at least one additional polymer material comprises photoresist pre-mixed with phosphor.

9. The LED array of claim 1, wherein the top of the at least one additional polymer material has a hydrophilic surface.

10. The LED array of claim 1, wherein the at least one additional polymer material is pre-mixed with an infrared radiating material.

11. The LED array of claim 10, wherein the infrared radiating material is selected from the group consisting of a ceramic and a carbon-based nanostructure.

12. The LED array of claim 1, further comprising a board wherein the LED array is flip mounted thereon with the substrate being above the first and second LED devices.

13. The LED array of claim 1, wherein a depth of the trench in the substrate ranges from 20 microns to 100 microns.

14. The LED array of claim 12, wherein the LED array is flip mounted on the board with the substrate removed.

* * * * *